United States Patent
Yamada

(10) Patent No.: US 9,318,665 B2
(45) Date of Patent: Apr. 19, 2016

(54) LIGHT EMITTING DEVICE INCLUDING FLEXIBLE SUBSTRATE, LIGHT EMITTING ELEMENT, SEALING RESIN, AND ADHESION LAYER

(71) Applicant: NICHIA CORPORATION, Anan-shi, Tokushima (JP)

(72) Inventor: Motokazu Yamada, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/025,962

(22) Filed: Sep. 13, 2013

(65) Prior Publication Data

US 2014/0077236 A1 Mar. 20, 2014

(30) Foreign Application Priority Data

Sep. 14, 2012 (JP) ................ 2012-202952

(51) Int. Cl.
| | | |
|---|---|---|
| H01L 29/18 | (2006.01) | |
| H01L 33/44 | (2010.01) | |
| H01L 25/075 | (2006.01) | |
| H05K 1/18 | (2006.01) | |
| H05K 3/00 | (2006.01) | |
| F21S 4/00 | (2006.01) | |
| F21V 21/08 | (2006.01) | |
| H01L 33/62 | (2010.01) | |
| H01L 33/54 | (2010.01) | |
| F21Y 101/02 | (2006.01) | |
| F21Y 103/00 | (2006.01) | |

(52) U.S. Cl.
CPC ............... *H01L 33/44* (2013.01); *F21S 4/006* (2013.01); *F21V 21/0808* (2013.01); *H01L 25/0753* (2013.01); *H05K 1/189* (2013.01); *H05K 3/0061* (2013.01); *F21Y 2101/02* (2013.01); *F21Y 2103/003* (2013.01); *H01L 33/54* (2013.01); *H01L 33/62* (2013.01); *H01L 2224/48091* (2013.01); *H01L 2224/73204* (2013.01); *H01L 2224/73265* (2013.01); *H05K 2201/10106* (2013.01)

(58) Field of Classification Search
CPC .... H01L 25/0753; H01L 33/44; H05K 1/189; H05K 3/0061; F21S 4/006
See application file for complete search history.

(56) References Cited

U.S. PATENT DOCUMENTS 6,857,767 B2 * 2/2005 Matsui .................. F21V 29/004
257/E25.02

(Continued)

FOREIGN PATENT DOCUMENTS

| JP | 2010-021123 A | 1/2010 |
| JP | 2012-043756 A | 3/2012 |

*Primary Examiner* — William F Kraig
*Assistant Examiner* — Vicki B Booker
(74) *Attorney, Agent, or Firm* — Global IP Counselors, LLP

(57) ABSTRACT

A light emitting device includes a flexible substrate, at least one light emitting element, a sealing resin and an adhesion layer. The flexible substrate includes a flexible base member and a plurality of wiring portions disposed on one surface of the base member. The light emitting element is arranged on a first surface of the flexible substrate and electrically connected to the wiring portions. The sealing resin seals the light emitting element. The adhesion layer is arranged on a second surface of the flexible substrate different from the first surface of the flexible substrate. The adhesion layer has a small thickness portion corresponding at least to a region on the first surface where the at least one light emitting element is arranged. The small thickness portion of the adhesion layer has a thickness smaller than a thickness of regions of the adhesion layer other than the portion.

9 Claims, 5 Drawing Sheets

(56) References Cited

U.S. PATENT DOCUMENTS 7,273,987 B2* 9/2007 Becker ................ H05K 1/0204
174/252

2008/0225523 A1* 9/2008 De Samber ............... F21K 9/00
362/249.01

2013/0001633 A1* 1/2013 Imai et al. ...................... 257/99

* cited by examiner

LIGHT EMITTING DEVICE INCLUDING FLEXIBLE SUBSTRATE, LIGHT EMITTING ELEMENT, SEALING RESIN, AND ADHESION LAYER

CROSS-REFERENCE TO RELATED APPLICATIONS

This application claims priority to Japanese Patent Application No. 2012-202952 filed on Sep. 14, 2012. The entire disclosure of Japanese Patent Application No. 2012-202952 is hereby incorporated herein by reference.

BACKGROUND OF THE INVENTION

1. Field of the Invention

The present invention relates to a light emitting device which includes a flexible substrate and at least one light emitting element.

2. Discussion of the Related Art

A light emitting device has been proposed in which a light emitting device having at least one light emitting element is arranged on a flexible substrate. Such a light emitting device includes an adhesive layer or a magnet tape on a back surface side of the flexible substrate so that the device can be installed on various places such as a mounting substrate or a narrow surface, an irregular surface and a non-linear location such as an L-shape (see for example, Patent Literature 1: JP2010-21123A, and Patent Literature 2: JP2012-43756A).

SUMMARY OF THE INVENTION

In the case where the adhesive layer and/or the magnet tape is disposed on the whole surface of the back surface side of the substrate, particularly on the back surface side of the substrate which is the opposite side from the region where the at least one light emitting element is mounted, and in the case where such a light emitting device is installed on a mounting substrate or various locations, due to the adhesion layer, the light emitting element itself, together with the flexible substrate, will be fixed to the mounting substrate, which may result in a stress on the light emitting element. This may result in failures such as deterioration of the light emitting element itself and detachment of the light emitting element from the flexible substrate.

The present invention is devised to solve the above-described problems, and an object of the present invention is to provide a light emitting device in which stress loaded on the light emitting element can be minimized.

The present invention includes the aspects described below.

(1) A light emitting device includes a flexible substrate including a flexible base member and a plurality of wiring portions disposed on one surface of the base member; at least one light emitting element arranged on a first surface of the flexible substrate and electrically connected to the wiring portions; a sealing resin sealing the light emitting element; and an adhesion layer arranged on a second surface of the flexible substrate different from the first surface of the flexible substrate. The adhesion layer has a small thickness portion corresponding at least to a region on the first surface where the at least one light emitting element is arranged. The small thickness portion of the adhesion layer has a thickness smaller than a thickness of regions of the adhesion layer other than the portion.

(2) A light emitting device includes a flexible substrate including a flexible base member and a plurality of wiring portions disposed on one surface of the base member; at least one light emitting element arranged on a first surface of the flexible substrate and electrically connected to the wiring portions; a sealing resin sealing the light emitting element; and an adhesion layer arranged on a second surface of the flexible substrate different from the first surface of the flexible substrate. The adhesion layer has a non-adhesive region corresponding at least to a region on the first surface where the at least one light emitting element is arranged. The non-adhesive region is covered with a non-adhesive layer.

(3) A light emitting device includes a flexible substrate including a flexible base member and a plurality of wiring portions disposed on one surface of the base member; at least one light emitting element arranged on a first surface of the flexible substrate and electrically connected to the wiring portions; a sealing resin sealing the light emitting element; and an adhesion layer and a support member arranged in this order on a second surface of the flexible substrate different from the first surface of the flexible substrate. The support member has a recess in a region corresponding at least to a region on the first surface where the at least one light emitting element is arranged.

The present invention can provide a light emitting device in which stress loaded on the light emitting element can be minimized.

DETAILED DESCRIPTION OF EMBODIMENTS

Figure 1A:
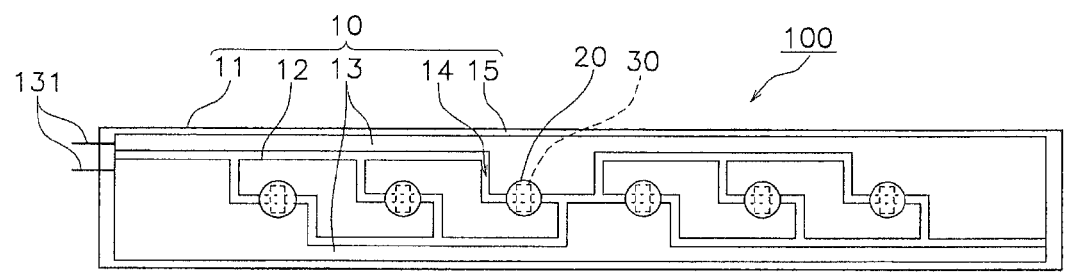
FIG. 1A is a schematic plan view showing an embodiment of a light emitting device according to the present invention.
Figure 1B:
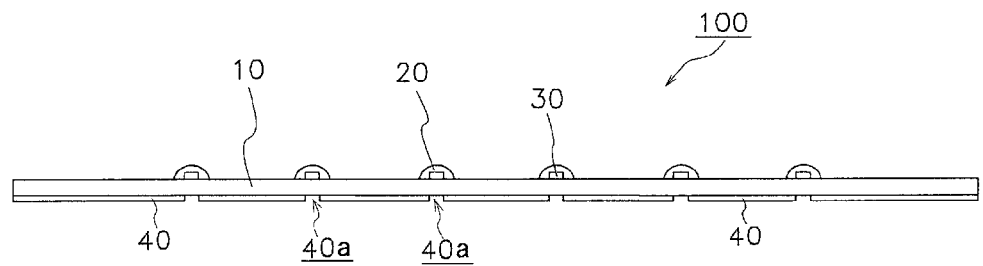
FIG. 1B is a schematic side view showing an embodiment of a light emitting device according to the present invention.
Figure 1C:
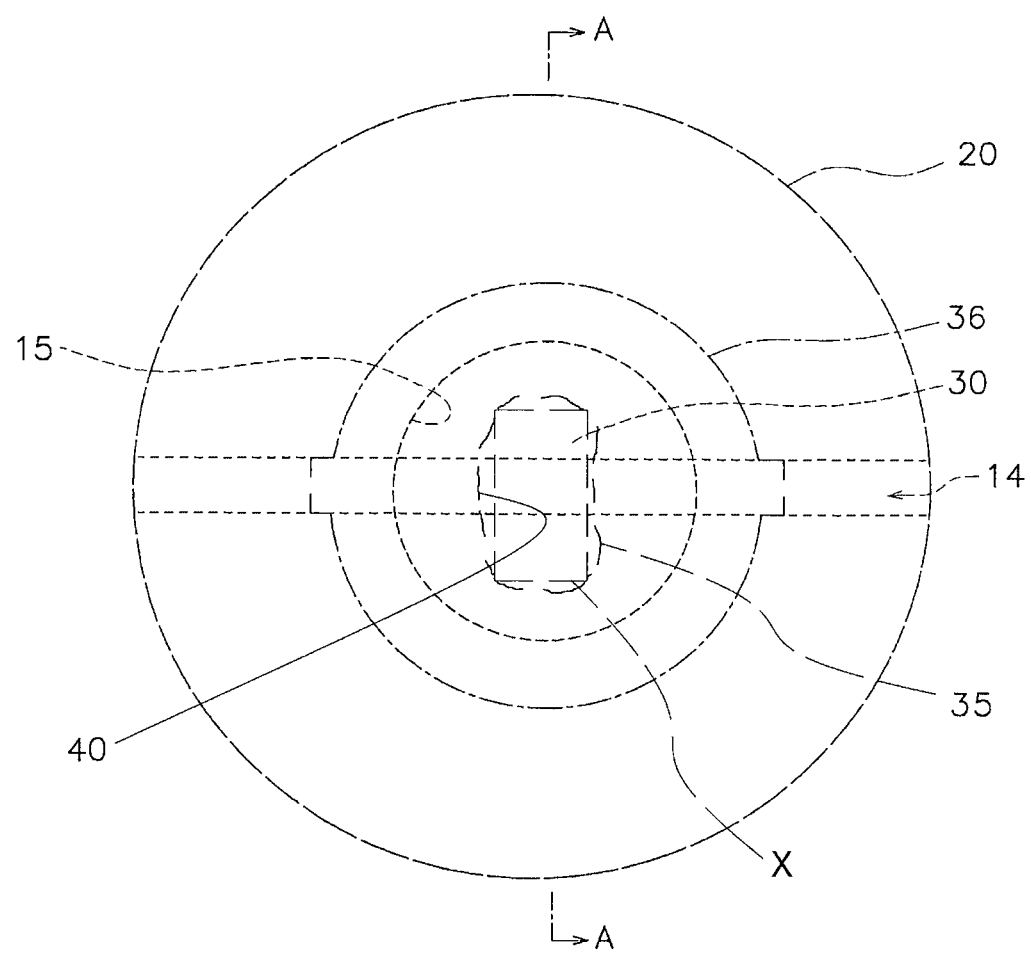
FIG. 1C is an enlarged view in the vicinity of a light emitting element on the back surface of a flexible substrate.

A light emitting device according to the present disclosure includes mainly, a flexible substrate, a light emitting element, a sealing resin, and an adhesion layer. Such a light emitting device has flexibility, so that it can be installed to conform to a curved surface. With a configuration where the light emitting device is extended in a longitudinal direction, the light emitting device can be stored rolled-up on a reel etc.

Flexible Substrate

The flexible substrate is a basis material for a light emitting device and can be formed with an appropriate shape (size and length) according to the purpose and applications. The flexible substrate at least includes a flexible base member and a plurality of wiring portions arranged on a surface of the base member. In the flexible substrate, the surfaces of the wiring portions (surfaces at the opposite side from the side where the base member is arranged) are preferably covered with an insulating layer except a part of the wiring portions connected to the light emitting element. The flexible base member is preferably made of a flexible insulating material. Such a material is not specifically limited and, for example, can be formed preferably by using an insulating sheet. More specifically, a resin such as a polyethylene terephthalate, a polyimide, and a liquid crystal polymer may be preferably employed. The material of the base member can be appropriately selected in view of the type of mounting of the light emitting elements, the reflectance, adhesion with other members, etc. Particularly, in the case where solder is used for mounting light emitting elements, polyimide, which has high heat-resisting property, is preferably used. In addition, a material constituting the base member may contain a material having high optical reflectance (for example, a white filler such as titanium oxide). The flexible base member may have a thickness from about 10 µm to about several millimeters, and particularly, a thickness from about 10 µm to about 100 µm is preferable.

The shape of the base member is not specifically limited and various shapes can be employed. For example, a shape such as a quadrangular shape, a rectangular shape, a polygonal shape, a circular shape, an elliptical shape, or a shape which is a combination of these shapes may be employed. In the case where the light emitting device is used for straight tube-type lamps, an elongated shape with a length ten times or greater than the width in lateral direction may be preferably employed. For example, for a straight tube-type lamp with a length of about 120 cm, a base member having a width of 0.5 cm to 5 cm and a length of 30 cm to 120 cm may be employed. In the case where a flexible base member is employed, several units of such an elongated base member (flexible substrate) can be processed together by way of roll-to-roll method. In this case, sprocket hole may be provided in the base member.

The plurality of wiring portions are electrically conductive members directly or indirectly connected to the light emitting element, and allow the supply of current from an external power source, and are disposed on one surface of the base member. Generally, the light emitting element is mounted on the wiring portions. The wiring portions may be made of a thin single-layer or stacked-layer structure of metal such as copper, gold, silver, or aluminum or alloy thereof. The wiring portion may be arranged not only on a single surface of the base member, but also on an inner side or on another surface according to the flexible substrate. The wiring portions have, for example, a thickness which does not impair the flexibility of the substrate and a thickness of about 8 µm to 150 µm is preferable. The shape (pattern) of a plurality of wiring portions is not specifically limited, and generally, a similar shape or a shape conforming to the shape or pattern of the wiring of the flexible substrate for mounting a plurality of light emitting elements may be employed. Particularly, in consideration of the strength etc., based on such as heat releasing property of the light emitting elements and bending and/or breaking of the flexible substrate. For example, a polygonal shape such as a crank shape, a triangular shape, and a quadrangular shape, a shape with no sharp corners such as a circular shape and an elliptical shape, and a shape of those with partially irregular shape may be employed singly or in combination. The corners of the wiring portions are preferably rounded.

The plurality of wiring portions are arranged spaced apart from each other in which, in addition to the wiring portions directly or indirectly electrically connected to corresponding light emitting elements, a wiring portion which does not contribute to conduction of electricity and has a similar shape or a different shape may also be arranged. The wiring portion which does not contribute to providing electrical continuity can serve as a mounting portion for a heat releasing member. For example, in the case where the base member has a rectangular shape, the wiring portions which do not contribute to providing electrical continuity are preferably arranged extended to the longitudinal end portions and at the both sides of the wiring portions in the lateral direction. The wiring portions may be provided with terminals for external connection. For example, connectors etc. may be arranged to supply electricity to light emitting elements from external power source. The wiring portions which do not contribute to providing electrical continuity can serve as a positioning mark for mounting the light emitting elements and other electrical components. Such a wiring portion, particularly in the case where a part of the wiring portions is arranged on approximately the entire surface of the base member (preferably arranged without having a gap), stress which is generated by, for example, bending of the flexible substrate and loaded on the light emitting elements and the sealing member, can be reduced. Specifically, in the case where a base member of elongated shape is used, the wiring portions are preferably arranged elongated along the longitudinal direction of the base member, and more preferably, the wiring portions are arranged with a length of ⅓ to 1 of the longitudinal length of the base member. The wiring portions capable of serving as terminals are made up of a positive terminal and a negative terminal and the number of the wiring portions which constitute a pair of the terminal is not specifically limited. For example, each of the pair of terminal portions may be made up of a single terminal or may be made up of a plurality of terminals. The wiring portions capable of serving as terminals are, for example, preferably connected to a pair of external wirings respectively. With this arrangement, electric power is supplied from external wirings. The pair of external wirings may be connected to corresponding portions of known connectors (not shown) etc.

Arranging the wiring portions in a relatively large area with a combination of wiring portions having various shapes allows increase of the arrangement degree of freedom of the light emitting device. For example, with a rectangular base member, it can be possible that six light emitting elements are arranged three in the longitudinal direction and two in the lateral direction as one block and connected in parallel, then, twelve blocks are arranged in the longitudinal direction and connected in series by the wiring portions which can serve as a pair of terminal portions. The base member may have an approximately square shape, an approximately circular shape, or an approximately ellipsoidal shape, and one light emitting element may be connected to the common, positive and negative wiring portions respectively. Arranging the wiring portions on one surface respectively with the largest possible area allows for an increase in heat dissipation.

On one surface of the base member, the plurality of wiring portions are spaced apart from each other, and thus there are grooves (that is, portions exposing the base member) in between them. The grooves are arranged between the wiring portions, so that the shapes of the grooves are in conformity to the shapes of the wiring portions, which may be, for example, a crank shape. The width of the grooves is preferably narrower than the width of the wiring portions, in other words, that allows a wiring portion to have a larger area, and for example, a width of about 0.05 mm to 5 mm may be employed.

Further, in the case where the wiring portions (both wiring portions contribute/not contribute to electrical continuity) are arranged on the whole area of one surface of the base member with relatively large area, appropriate strength can be added while maintaining its flexibility, so that disconnection of wiring portions and breakage of substrate due to bending of the flexible substrate can be prevented effectively. More specifically, the wiring portions may be arranged with an area of 50% or greater, preferably 70% or greater, more preferably 90% or greater than the area of the base member.

As described above, a part of the wiring portion is preferably covered with an insulating layer. The insulating layer is not specifically limited but preferably can serve as a reflective layer to reflect the light emitted from the light emitting element. The insulating layer has, as described later, an opening from a part of which the wiring portions are exposed. The insulating layer preferably covers approximately the entire surface of the flexible substrate except for the opening, thus, the insulating layer preferably covers the groove portions between the wiring portions described above. In order to at least connect the light emitting element with a pair of, positive and negative, two wiring portions, the opening is arranged to expose the wiring portions. The number and arrangement of light emitting elements are adjusted according to the output power, light distribution, or the like, and accordingly, the number and the positions of the openings are determined. The number of the openings may be the same as the number of the light emitting element or the number of the openings may be different than the number of the light emitting element. For example, in the case where 20 units of light emitting elements are needed and each light emitting element to be mounted in one opening, 20 openings are formed in the covering layer. Alternatively, in the case where two light emitting elements are to be mounted in one opening, 10 openings are arranged. Thus, the number and arrangement of the opening are determined according to the number and arrangement of the light emitting elements. In some cases, the light emitting elements may not be mounted in the openings. For example, in the case where the light emitting devices are manufactured in several ranks (for example, light emitting devices of different outputs), with the use of a common flexible substrate (that is, the number and arrangement of the openings provided in the covering layer), an opening not to be mounted with a light emitting element, to obtain different optical output. Also, a region lacking the covering layer may be arranged in the region for establishing electrical continuity such as a connector. In the case of flip-chip mounting, a part of groove is preferably exposed in a single opening.

The insulating layer is preferably made of a material which reflects emission of the light emitting element and wavelength-converted light by a wavelength converting member to be described later. Examples of the materials include a resin such as a phenol resin, an epoxy resin, a BT resin, a PPA, a silicone resin and a urea resin. Also, those materials may be added with a filler such as $SiO_2$, $TiO_2$, $Al_2O_3$, $ZrO_2$, or MgO, for example.

Light Emitting Element

In the above-described opening of the insulating layer on the flexible substrate, the light emitting element may be arranged on the two wiring portions in a bridged manner or arranged on a single wiring portion. With such arrangements, the light emitting element can be electrically connected to the pair of positive and negative wiring portions respectively. The number and/or tone of color tone and/or arrangement of the plurality of light emitting elements are determined to satisfy the output and light distribution designed for the light emitting device and accordingly, the shapes and the positions of the wiring portions and the openings are adjusted. For example, on the flexible substrate, the light emitting elements can be arranged in a substantially center part in the lateral direction, and in a line in the longitudinal direction.

The light emitting element includes a semiconductor structure, a p-side electrode, and an n-side electrode. The semiconductor structure, for example, includes an n-type layer, an active layer, and a p-type layer respectively made of a gallium nitride-based semiconductor and stacked in the order on a light-transmissive sapphire substrate. It is not limited to gallium nitride-system semiconductors, a II-IV system semiconductor or a III-V system semiconductor may be used. The n-side electrode and the p-side electrode can be formed with a single layer or staked-layer of known materials. The light emitting elements can be arranged and/or mounted on the flexible substrate (generally on the two wiring layers in a bridged manner) by using a bonding member.

The light emitting element can be mounted on the flexible substrate in a flip-chip manner or a face-up manner. For example, in the case where the light emitting element is mounted on the flexible substrate in a flip-chip manner, the p-side electrode and the n-side electrode are connected to a pair of wiring portions via a pair of bonding member respectively. For the bonding member, for example, a solder of Sn—Ag—Cu system, Sn—Cu system, or an Au—Sn system, or a metal bump such as Au, an anisotropic conductive paste, or a Ag paste can be used. In the case of face-up mounting, the light emitting element is fixed on the base member (on the wiring portion) by an insulating bonding member such as a resin or by an electrically conductive bonding member as described above, and then, electrically connected to the wiring portions via wires. In the case where the substrate of the light emitting element is electrically conductive, the light emitting element is electrically connected by the bonding member as described above.

In addition to the light emitting element, a protective element such as a Zener diode or a related component may be arranged on one surface of the substrate. Such a protective element and related component can be arranged together in the opening where the light emitting element is mounted or in a different opening. They are preferably arranged at locations so as not to absorb the light from the light emitting element, and it is not necessary to dispose the same number of protective elements as the light emitting elements. Therefore, the protective element can be arranged at an appropriate position, for example, one protective element is mounted on a wiring portion, to which a plurality of light emitting elements are directly connected, at a position near a connector regardless of the arrangement of the light emitting elements.

Also, an underfill may be applied in the vicinity of the p-side electrode and n-side electrode, the bonding member, and the light emitting element, more specifically, in the groves between the wiring portions, the wiring portions, and the insulating layer. Generally, the underfill is applied between the light emitting element and the flexible substrate, and around the light emitting element. Examples of the underfill include a resin having its base polymer of, a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins. The underfill also preferably has a light reflectivity, so that a diffusion material or a reflective material such as $SiO_2$, $TiO_2$, $Al_2O_3$, $ZrO_2$, and MgO may be contained. With this arrangement, the light extracting efficiency can be enhanced and also at the flexible substrate, the portions where the light emitting elements are arranged can be reinforced efficiently.

Sealing Resin

The sealing resin can seal and cover the light emitting element on the flexible substrate. The sealing resin is preferably arranged to cover all the openings in the insulating layer described above. The shape of the sealing resin member is not specifically limited, but in view of light luminous intensity distribution and directivity of the light emitted from the light emitting element, a concave lens shape or a convex lens shape is preferably employed. Of those, a hemispherical convex lens shape may be more suitably employed. The sealing resin is preferably a light transmissive resin (for example, an epoxy resin, a urea resin, a silicone resin and the like, the resins exemplified as a material of the underfill). Particularly, in the case where the above-described underfill is disposed, the same kind of resin as in the underfill is more preferably used. In the specification, the term "transparency to light" means properties of transmitting about 60% or greater emission of the light emitting element, more preferably 70% or greater or 80% or greater of light emitted from the light emitting element.

The sealing resin member preferably includes a wavelength converting member such as a fluorescent material capable of absorbing light from the light emitting element and emitting light of different wavelength. Examples of such a wavelength converting member include an oxide-based fluorescent material, a sulfide-based fluorescent material, and a nitride-based fluorescent material. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material to emit green light, and a SCASN-based fluorescent material and a CASN-based fluorescent material to emit red light, are preferably used singly or in combination. Particularly, for the light emitting devices used for the display devices such as backlights of liquid crystal displays and TV-screens, a SiAlON fluorescent material and a SCASN fluorescent material are preferably used in combination. Also, for lighting applications, a YAG-based fluorescent material or a LAG-based fluorescent material and a SCASN-based fluorescent material or a CASN-based fluorescent material are preferably used in combination. The sealing resin may contain a light diffusing agent (barium sulfate, titanium oxide, aluminum oxide, silicon oxide, or the like). The size of the sealing resin is not specifically limited, but a size which would not impair the flexibility of the flexible substrate is preferable. For example, the size which allows completely covering the light emitting element or greater and has a diameter or length of about twice or less of the length of a side of the light emitting element is more preferable. More specifically, a side (or diameter) of about 1 mm to 4 mm can be employed.

Adhesion Layer

An adhesion layer is disposed on the other surface which is a different surface than the one surface (top surface) of the flexible substrate as described above, that is, an adhesion layer is disposed on the back-surface (in a more precise sense, a surface of the flexible substrate which is at the opposite side (back-surface) from the side where the wiring portions are arranged).

The adhesion layer can be formed by using an adhesive agent, a gluing agent, or the like. The adhesive agent and the gluing agent are not specifically limited and any adhesive agents and gluing agents which are commonly used at the time of bonding a plastic plate to an adherend can be used. Examples of the adhesive agent and the gluing agent include an acrylic resin system, an α-olefin system, a urethane resin system, an ethercellulose system, an ethylene-vinyl acetate resin system, an epoxy resin system, a vinyl chloride resin system, a chloroprene rubber system, a polyvinyl acetate resin system, a cyanoacrylate system, a silicone system, a water-based polymer-isocyanate system, styrene-butadiene rubber system, a nitride rubber system, a nitrocellulose system, a phenolic resin system, a modified silicone system, a polyamide system, a polyimide system, a polystyrene resin, a polyvinyl alcohol system, a polyvinylpyrrolidone resin system, a polyvinyl butyral resin system, a polybenz imidazole resin system, a melamine resin system, a urea resin system, and a resorcinol resin system.

The adhesion layer can be made by melting an above-listed adhesive agent or dissolving the agent in an appropriate solvent and directly applied on an appropriate location of a flexible substrate and drying/solidifying it. The adhesive agent can be coated and configured by using a coating method such as gravure coating method, roll coating method, spray coating method, lip coating method, or comma coating method, or a printing method such as gravure printing method or screen printing method. Alternatively, it may be such that on a base material having appropriate releasing property, the adhesive agent is coated and configured as described above to form an adhesive layer, then the adhesive layer is transferred on the flexible substrate. Further, the adhesive layer may be arranged by using a simple technique in which a commercially available double-sided tape or the like is used to obtain a predetermined shape, then, one side of adhesive surface is attached to the back surface of the flexible substrate.

The thickness of the adhesive layer is not specifically limited and for example, a thickness of about 5 μm to about 3 mm may be employed.

The adhesive layer has, in one embodiment to be described later, in a specific region, a portion having a smaller thickness (including a thickness of zero) than that of other regions. The portion having a smaller thickness generally indicates a recess or a portion having a substantially zero thickness in the adhesive layer in the surface (hereinafter may be referred to a "the other surface of the adhesive layer" or "back surface of the adhesive layer") which is at the opposite side from the side where the flexible substrate is disposed. In other words, the adhesive layer may include one or a plurality of recesses on its surface, may include one or a plurality of through holes formed in the adhesive layer, or may be arranged in various shapes such as island shapes, stripe shapes, or land shapes. The thickness of the portion having a small thickness may be about 0 to 80% of the thickness of other portions.

In the case where the adhesive layer has a portion having a small thickness as described above, a separating layer may be disposed in the portion having a small thickness. The separating layer can be made of any material as long as it does not exhibit adhesiveness, and a material which is generally used as a release agent can be employed. Examples of such a material include a melamine resin-based release agent, a silicone resin-based release agent, an acrylic resin-based release agent, a fluorine resin-based release agent, a cellulose derivative-based release agent, a urea derivative-based release agent, a polyolefin resin-based release agent, a paraffin-based release agent, and a composite-type release agent of these agents. The separating layer may be arranged, in a plan view, on only a part of the portion having a small thickness, but is preferably arranged on all portions having a small thickness. The thickness of the separating layer is not specifically limited, but is preferably not greater than the depth of the portion having a small thickness. The separating layer is generally flexible, so that the thickness can be greater than the depth of the portion having a small thickness in a range not greater than about 10%.

In another embodiment, the adhesive layer may be formed with a uniform thickness on all the other surfaces of the flexible substrate. As described above, in the case where the adhesive layer is formed with a uniform thickness on all the other surfaces of the flexible substrate, the regions on the other surfaces of the adhesive layer which correspond to the region on a surface where the light emitting element is arranged are preferably covered with a non-adhesive layer. The non-adhesive layer can be made of any material as long as the layer does not adhere the light emitting device to its adherend, but the layer preferably has heat-resisting property and/or insulation property. For example, the layer may be made of a resin or paper. More specifically, the layer may be made of polypropylene, polysulfone, polyimide, polyethylene terephthalate, polyethylene naphthalate, or the like, or an above-described material which constitutes the separating layer. The thickness of the layer is not specifically limited, and for example, about 5 to 200 µm may be employed.

The non-adhesive layer covers the other surfaces of the flexible substrate in addition to the case where the adhesive layer is formed with a uniform thickness on all the other surfaces of the flexible substrate, also to the case where, in a region on the other surfaces corresponding to the region on the one surface on which each light emitting element is arranged, there is a portion having a thickness smaller than the regions except for the other regions, in which, even when the thickness is very small, the portion having a small thickness may covered with the non-adhesive layer. In the specification, the expression "the thickness is very small" indicates that, for example, a thickness is about 20% or less than the thickness of the gluing agent (in other words, the portion having a small thickness has a thickness about 80% or greater than the thickness of the gluing agent).

In the case where the light emitting device includes such a non-adhesive layer, the portions directly under the light emitting elements and their respective surrounding area can be prevented from being adhered to the adherend, and also the light emitting element can be made in contact with the adherend via the flexible substrate, the adhesive layer, and the non-adhesive layer, so that heat generated from the light emitting element can be released efficiently to the adherend therethrough.

In the specification, the expression "region on the one surface where the light emitting element is arranged" may refer to a projected region of the light emitting element which has the same planar dimension as to that of the light emitting element, but may also refer to a region which includes the projected region and its surrounding region. The size of the region can be about 1 to 100 times, preferably about 1 to 50 times, more preferably about 1 to 20 times with respect to the planar dimension of the light emitting element. With the planar dimension as described above, stress due to a difference in the linear expansion coefficient between the adherend, that is the support member or mounting substrate, and the bonding member which bonds the flexible substrate or light emitting elements with the adherend can be maintained so that the stress is not experienced directly on the light emitting elements. Thus, bonding reliability of the light emitting elements can be improved. Further, heat dissipation to the support member etc., through the wiring portions of the flexible substrate can be secured.

The other surface of the adhesion layer (the opposite surface from the surface where the flexible substrate is disposed) is preferably covered with a release sheet regardless of presence of the non-adhesive layer. The release sheet is for protecting the surface of the bonding layer until the bonding layer is adhered to the adherend, and therefore is removed before the bonding operation. Examples of the release agent include a melamine resin-based release agent, a silicone resin-based release agent, an acrylic resin-based release agent, a fluorine resin-based release agent, a cellulose derivative-based release agent, a urea derivative-based release agent, a polyolefin resin-based release agent, a paraffin-based release agent, or a composite-type release agent of these agents. The release sheet can be used as the non-adhesion layer as described above, by leaving portions of the release sheet, instead of removing entirely, in the regions on the other surface of the adhesion layer at locations corresponding to the regions on the one surface where the light emitting elements are arranged.

The light emitting devices according to the embodiments of the present invention can be used by attaching to adherend, for example, to support members or mounting substrates. In the specification, the support member and the mounting substrate are not specifically limited, and various substrates such as a plastic substrate, a metal substrate, a ceramics substrate, or a substrate having a wiring or the like formed thereon or embedded therein can be employed. Among those, in view of heat dissipation, a metal substrate, for example a substrate made of aluminum is preferably employed. The thickness of the support member is not specifically limited and the thickness can be appropriately adjusted according to the material and mechanical strength of the support member, the final form of the light emitting device, or the like. The light emitting device according to the embodiments of the present invention is adhered to a support member or a mounting substrate with the use of an adhesion layer as described above, and thus is arranged at the other surface side of the flexible substrate.

In an embodiment, as described above, the adhesion layer includes a portion having a small thickness. Therefore, the portion having a small thickness is arranged in a non-adhesion state with respect to the support member. In other embodiments, as described above, a non-adhesive layer covers a part of the adhesion layer, so that even if the non-adhesive layer comes in contact with the support member, the adhesion layer itself can be disposed in a non-adhesion state.

Further in another embodiment, in the case where the support member is arranged at the other surface side of the flexible substrate of the light emitting device, in the regions corresponding to the regions on the one surface where the light emitting elements are arranged, recesses may be formed respectively in the surface of the flexible substrate side of the support member. With such recesses of the support member, regardless of the state of the adhesion layer and the presence of the non-adhesion layer, the region on the other surface corresponding to the region on the one surface of the flexible substrate where the light emitting devices are arranged can be arranged in non-adhesion and/or non-contacting state with respect to the support member. The depth of the recesses of the support member is not specifically limited and can be adjusted appropriately in view of the whole thickness, material, and mechanical strength etc. of the support member. For example, the depth of about 5 µm to 3 mm can be employed. In a different viewpoint, the depth may be about 5 to 50% of the thickness of the support member.

In the light emitting devices according to the embodiments of the present invention, as described above, the region on the other surface corresponding to the region on the one surface of the flexible substrate where the light emitting elements are arranged is secured to maintain a state not to be fixed to the support member or the like, stress due to a difference in the linear expansion coefficient between the support member etc., and the bonding member etc., which bonds the flexible substrate or light emitting elements can be reduced or avoided from directly experienced on the light emitting elements by partially deforming the flexible substrate side. With this arrangement, bonding reliability of the light emitting elements can be improved. The performance and/or function described above cannot be realized with conventional rigid substrates.

Embodiments of the light emitting devices according to the present invention will be described below with reference to the drawings.

Embodiment 1

The light emitting device 100 according to Embodiment 1 includes, as shown in FIG. 1A to FIG. 1D, the flexible substrate 10, the light emitting elements 30 arranged on the surface of the flexible substrate 10, the sealing resin members 20 which are disposed on the flexible substrate 10 and cover the respective light emitting elements 30, and the adhesion layer 40. The flexible substrate 10 has a stacked layer structure made up of a flexible base member 11 made of a polyimide (about 25 µm thickness), wiring portions 12 (about 35 µm thickness) arranged on one surface of the base member 11 and spaced apart from each other by a groove portion 14, and an insulating reflective layer 15 (about 15 µm thickness and made of a silicone-system resin containing titanium oxide) disposed over them. In the flexible substrate 10, in order to establish electrical connection with the light emitting elements 30, a grove portion 14 formed between the wiring portions 12 and the wiring portions 12 are exposed from the reflective layer 15 in some regions of the substrate 10. Among the wiring portions 12, a pair of wiring portions 13 are connected to external terminals 131 respectively.

Figure 1D:
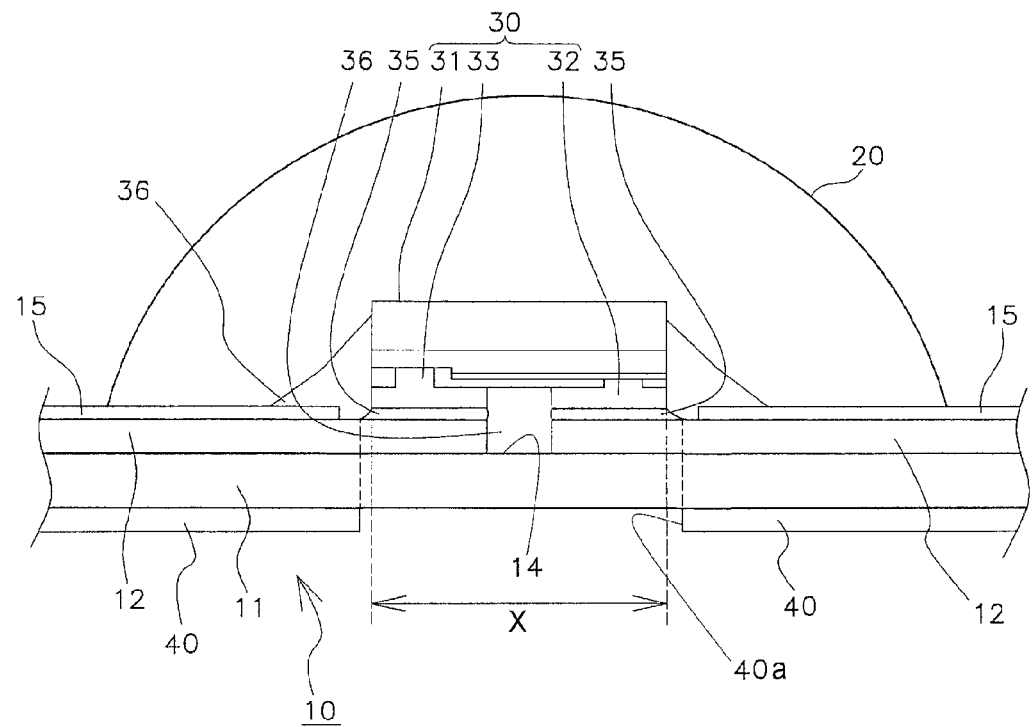
FIG. 1D is a cross sectional view taken along line A-A of FIG. 2.

Each of the light emitting elements 30 includes, as shown in FIG. 1D, a semiconductor structure 31, a p-side electrode 32, and an n-side electrode 33. In the semiconductor structure 31, the p-type semiconductor layer and the light emitting layer are partially removed to expose the n-type semiconductor layer, and an n-side electrode 33 is formed on the exposed surface. A p-side electrode 32 is formed on the upper surface of the p-type semiconductor layer. Thus, the n-side electrode 33 and the p-side electrode 32 are formed on the same surface side with respect to the semiconductor structure 31. The light emitting element 30 as described above is arranged on a pair of the wiring portions 12 which are exposed from the reflective layer 15 of the flexible substrate 10, with the surface having the n-side electrode 33 and the p-side electrode 32 facing downward, and is electrically connected to the pair of wiring portions via the bonding member 35. The groove portion 14 between the pair of wiring portions 12 is filled with an underfill 36 (a silicone resin which contains about 30 weight % of titanic oxide).

Over the flexible substrate 10 having the light emitting element 30 mounted thereon, a sealing member 20 for sealing the light emitting element 30 and the covering layer 15 arranged at outer side than the light emitting element 30 is formed. The sealing member 20 is, for example, made of a silicone resin containing about 10 weight % of a fluorescent material (LAG·SCASN). That is, the sealing member 20 contains the same type of polymer used to make the underfill 36. The outer periphery of the sealing member 20 is arranged on the covering layer 15 of the flexible substrate 10. The sealing member 20 is formed in a hemispherical shape by potting etc. The diameter of the sealing member 20 is, for example, about 3.5 mm.

An adhesion layer 40 is formed on the backside of the flexible substrate 10. The adhesion layer 40 includes portions having a thickness that is substantially zero, in other words, through holes 40a (one example of a small thickness portion), in regions on the backside of the flexible substrate 10 at locations corresponding to the respective regions on the surface of the flexible substrate 10 where the light emitting elements 30 are arranged. The arrangement of the adhesion layer 40 is such that, as long as the adhesion layer portions having a small thickness (including zero thickness) are arranged in the regions on the backside of the flexible substrate 10 at locations corresponding to the respective regions on the surface of the flexible substrate 10 where the light emitting elements 30 are arranged, the adhesion layer (including adhesion layer portions having a small thickness) may or may not be arranged in regions on the backside of the flexible substrate 10 corresponding to the regions where the light emitting elements 30 are not arranged.

In the specification, the expression "regions of the surface of the flexible substrate 10 where the light emitting elements 30 are arranged" refers to the regions inner sides of the outer periphery X (FIG. 1C) of the light emitting elements 30. That is, it means all the regions which are located from the outer periphery X of the light emitting elements 30 to the regions which are located opposite sides with respect to the centers of the light emitting elements 30, respectively. However, due to the bonding of the light emitting elements 30 as described above, the bonding member 35 may be squeezed out from the outer periphery X of the light emitting elements 30. Thus, in such cases, the regions where the light emitting elements 30 are arranged also include the regions where the bonding member 35 is squeezed out. In other words, in the light emitting device 100, at the entire surface of the backside of the flexible substrate 10, the adhesion layer 40 is provided with the through holes 40a which are formed in conformity to the size and arrangement of the light emitting elements 30 and the squeezed-out portions of the bonding member for bonding the light emitting elements 30. The through holes 40a are not filled with any members and the backside surface of the flexible substrate 10, that is, the flexible base member 11 is exposed in each of the through holes 40a. The adhesion layer 40 is, for example, formed by an acrylic adhesive with a thickness of about 50 µm.

For such a light emitting device, for example, a commercial double-side tape is prepared in strips with a width adjusted to the lateral width of the flexible substrate 10. Then, the light emitting elements 30 are mounted on the respective strips of tape, and through holes are formed at locations in view of the amount of the bonding member 35 which may be squeezed out. Then, those are attached on the back surface of the flexible substrate 10 by way of appropriate alignment.

As described above, on the back surface of the flexible substrate 10 which corresponds to the region where the light emitting elements 30 are arranged, the adhesion layer 40 is not disposed and thus is exposed. Therefore, even in the case where the light emitting device 100 is attached to an adherend via the adhesion layer 40, the flexible substrate 10 where the light emitting elements 30 are arranged is not fixed to the adherend. Also, the light emitting elements 30 are not fixed to the adherend.

In the case where a mounting substrate made of a metal such as aluminum is used as the adherend, due to a considerably greater expansion rate of the aluminum (thermal expansion coefficient: 25 ppm/° C.) with respect to that of the polyimide (thermal expansion coefficient: 17 ppm/° C.) which is the flexible base member 1 which constitutes the flexible substrate 10, aluminum expands substantially by the heat generated from the light emitting elements 30. More specifically, with a 50° C. rise in temperature and at every 1 m, aluminum expands about 0.4 mm greater with respect to the base member 1. Therefore, in the case where the regions directly under the light emitting elements 30, that is, the portions of the back surface of the flexible substrate 10 corresponding to the regions X as described above, are fixed to the mounting substrate with the adhesion layer 40 which is provided to the regions, cracks may be generated in the solder which is the bonding member 35 located around the light emitting elements 30, which may resulting in detachment of the light emitting elements 30 from the flexible substrate 10. On the other hand, as described above, in the case where the adhesion layer 40 is not disposed on the back surface of the flexible substrate 10 at the locations corresponding to the regions X, even if aluminum expands significantly, the portions around the light emitting elements 30 are not fixed thereto and can be prevented from being pulled by the expansion. Thus, generation of cracks in the bonding member 35 can be prevented, so that detachment of the light emitting elements 30 from the flexible substrate 10 can be efficiently prevented.

Moreover, in the light emitting device 100, the adhesion layer 40 is made of, for example, a flexible material such as an adhesive agent. Therefore, the flexibility of the light emitting device 100 itself is not impeded by the presence of the adhesion layer, and thus the light emitting device 100 can be applied to adherends of any shapes.

Embodiment 2

Figure 2:
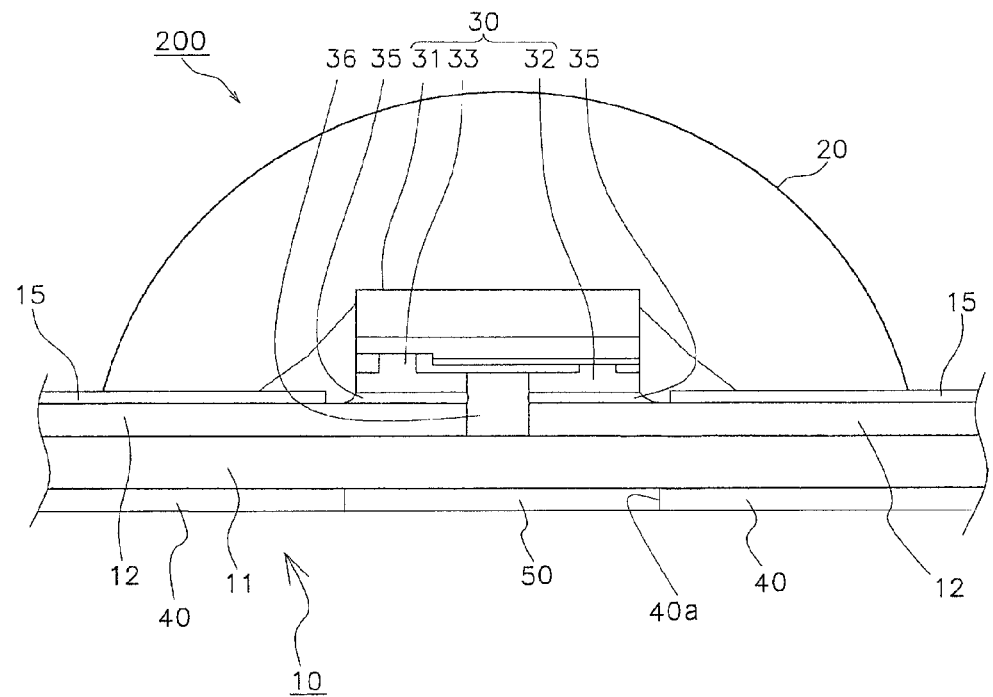
FIG. 2 is a schematic cross-sectional view showing a major part of a light emitting device according to another embodiment of the present invention.

The light emitting device 200 according to Embodiment 2 has a substantially similar structure as that of the light emitting device 100 except that, for example, as a structure shown in FIG. 2, the structure includes on the back surface of the flexible substrate 10, the separation layer 50 made of silicone is formed in the through holes 40a of the adhesion layer. The separation layer 50 is formed with a thickness approximately similar to the thickness of the adhesion layer 40.

Such a separation layer portions 50 are disposed, for example, such that a mask having openings in regions correspond to the regions X described above is prepared and placed on the back surface of the flexible substrate 10 so that the openings of the mask are aligned correspond to the regions X. Next, using the mask, by way of coating, the separation layer portions are formed on the back surface of the flexible substrate 10 at locations corresponding to the regions X. Then, the adhesion layer 40 is coated on the all surface of the back surface of the flexible substrate 10 which includes the portion on the separation layer 50. With this, the material of the adhesion layer 40 is rejected by the separation layer 50 and the adhesion layer 40 having aligned through holes 40a in regions except for the regions of the separation layer 50 can be formed.

As described above, even in the case where the separation layer 50 is provided, the effects similar to that in Embodiment 1 can be exerted and also formation of the adhesion layer portions 40 on appropriate locations can be performed easily.

In the case where the thickness of the separation layer 50 is designed similar to the thickness of the adhesion layer 40, at the time of mounting the light emitting device 200 on the mounting substrate, due to the presence of the adhesion layer 40, the separation layer 50 is brought in contact with the mounting substrate, so that paths which can release heat from the light emitting elements 30 to the mounting substrate side can be formed. With this, heat dissipation from the light emitting elements 30 in the light emitting device 200 can be securely obtained.

Moreover, in the case where the thickness of the separation layer 50 is smaller than the thickness of the adhesion layer 40, due to the adhesion layer, at the time of mounting the light emitting device 200 on the mounting substrate, gaps are generated between the separation layer portions 50 and the mounting substrate, and due to movement of the air or a gas in the gaps allows secure heat dissipation.

Embodiment 3

Figure 3:
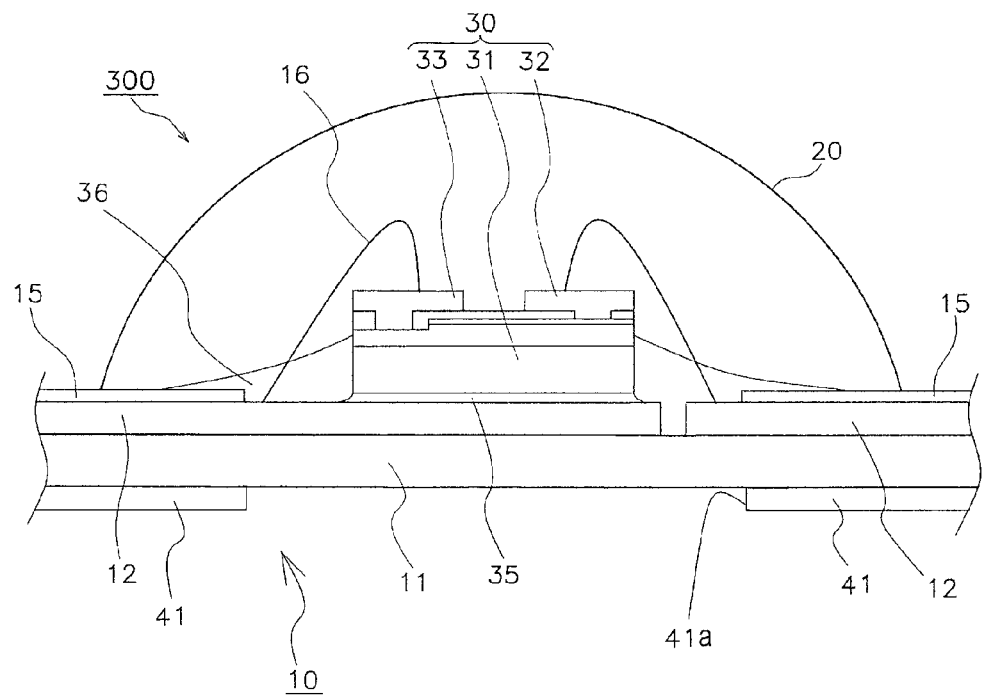
FIG. 3 is a schematic cross-sectional view showing a major part of a light emitting device according to yet another embodiment of the present invention.

The light emitting device 300 according to Embodiment 3 has a substantially similar structure as that of the light emitting device 100 except that, as a structure shown in FIG. 3, each of the light emitting elements 30 is mounted on the wiring portions 12 of the flexible substrate 10 in a face-up manner, the n-side electrode and the p-side electrode 32 are respectively electrically connected to the corresponding wiring portions 12 via respective wires 16. Thus, on the flexible substrate 10, the region where the wiring portions 12 being exposed from the reflective layer 15 is somewhat increased, the connection regions of the wires 16 and the wiring portions 12 are also included in the corresponding region on the backside surface of the flexible substrate 10 in the similar manner as in the regions where the light emitting elements are arranged, and accordingly, the size of the through holes 41a of the adhesion layer 41 of the flexible substrate 10 are increased. That is, the adhesion layer 41 includes the through holes 41a which are defined by the outer periphery of the region on the one surface where the light emitting elements are arranged, and further, which are extended to outer sides than the respective connecting portions of the wiring portions 12 and the wires 16.

In the light emitting device 300 having such light emitting elements 30, the expression "a region on the flexible substrate 10 where the light emitting elements 30 are arranged" does not refer to the all regions which are located from the outer border of the light emitting elements 30 or the bonding member 35 to the opposite side with respect to the center of the light emitting elements 30, but refers all the region which are located from the border somewhat outer side of the connecting portions of the wiring portions 12 and their respective wires 16 (outer border with respect to the light emitting elements 30).

As described above, the through holes 41a are extended not only to the regions where the light emitting elements 30 are arranged but also to the portions of the back surface of the flexible substrate 10 corresponding to the portions which are wire bonded to the wiring portions 12. Also, the adhesion layer 41 is not disposed on the portions and the portions are exposed. Thus, even in the case where the light emitting device 100 is attached to an adhered by the adhesion layer 41, the flexible substrate 10 is not fixed by the adherend even in the regions where the light emitting elements are arranged and the regions wire-bonded to the wiring portions 12. With this arrangement, not only prevention of generation of cracks in the bonding member 35, but also prevention of disconnection of the wires can be securely prevented, and thus detachment of the light emitting elements 30 from the flexible substrate 10 and generation of defects on the light emitting elements 30 can be efficiently prevented.

Embodiment 4

Figure 4:
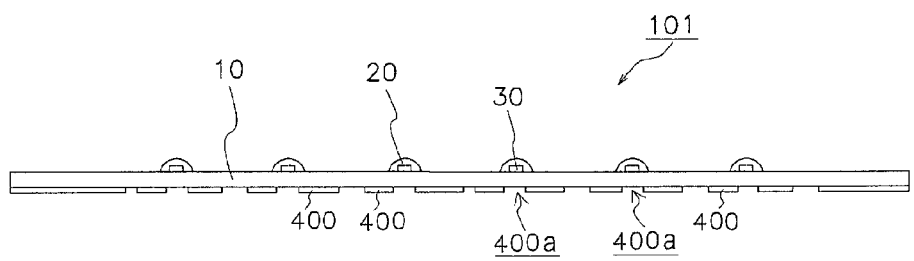
FIG. 4 is a schematic side view showing a light emitting device according to still another embodiment of the present invention.

The light emitting device 101 according to Embodiment 4 has a substantially similar structure as that of the light emitting device 100 according to Embodiment 1, except that, as shown in FIG. 4, the adhesion layer 400 is disposed not on the entire surface but only on a portion of the back surface of the flexible substrate 10 at locations correspond to the outer periphery of the regions where the light emitting elements 30 are arranged, in other words, the adhesion layer 400 is arranged in island shapes. Through holes 400a (one example of a small thickness portion) are arranged on the adhesion layer 400. With this arrangement, the light emitting device 101 exhibits the same level of effects as that with the light emitting device 100 of Embodiment 1.

Embodiment 5

Figure 5:
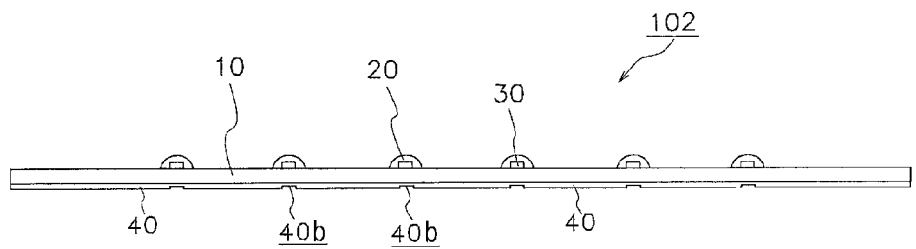
FIG. 5 is a schematic side view showing a light emitting device according to still another embodiment of the present invention.

The light emitting device 102 according to Embodiment 5 has, as shown in FIG. 5, a substantially similar structure as that of the light emitting device 100 of Embodiment 1, except that instead of the through holes 4, thin layer portions 40b (one example of a small thickness portion) are arranged on the adhesion layer 40. The thickness of the thin layer portion is, for example, about 20% of the thickness of other adhesion layers. With this arrangement, even with the presence of the adhesion layer 40 in the thin layer portions 40, substantially do not make in contact with the mounting substrate, so that the light emitting device 102 exhibits the same level of effects as that with the light emitting device 100 of Embodiment 1. Also, the air layers are formed in the thin layer portions 40b, and with the air layers, the heat dissipation can be improved.

Embodiment 6

Figure 6:
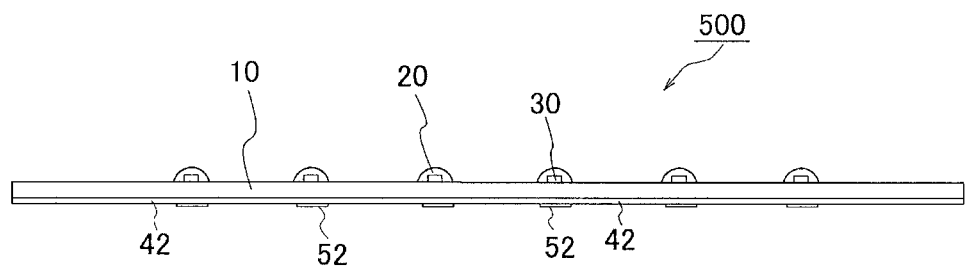
FIG. 6 is a schematic side view showing a light emitting device according to still another embodiment of the present invention.
Figure 7:
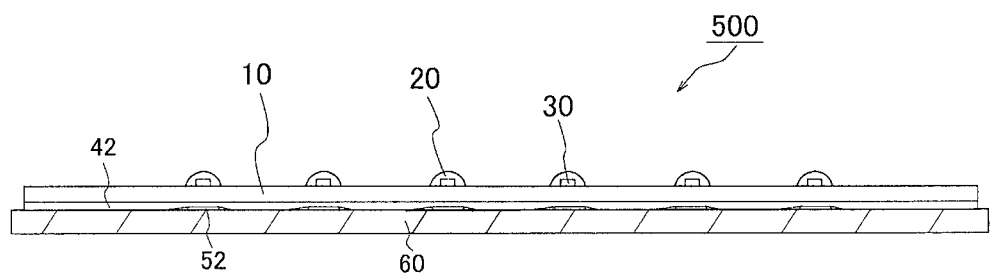
FIG. 7 is a schematic side view showing a light emitting device according to still another embodiment of the present invention.

The light emitting device 500 according to Embodiment 6 has, as shown in FIG. 6, a substantially similar structure as that of the light emitting device 100 of Embodiment 1, except that the adhesion layer 42 is formed with a uniform thickness, and the back surface regions of the adhesion layer 42 at locations corresponding to the regions where the light emitting elements are arranged are partially covered with a non-adhesion layer 52 made of a polypropylene layer having a thickness of about 10 μm. When the light emitting device 500 as described above is, as shown in FIG. 7, mounted on the substrate (for example an aluminum substrate with a thickness of several mm) 60, the non-adhesion layer 52 is not adhered to the support member 60, but deformation of the flexible substrate 10 allows approximately whole surface of the adhesion layer 42 to be adhered to the support member 60, and thus the light emitting device 500 exhibits the same level of effects as that with the light emitting device 100 of Embodiment 1. Also, the portions directly under the light emitting elements 30 contact with the support member via the adhesion layer 42 and the non-adhesion layer 52, so that in a similar manner as that in the light emitting device 200 of Embodiment 2, with the use of this region, heat dissipation can be improved.

Embodiment 7

Figure 8:
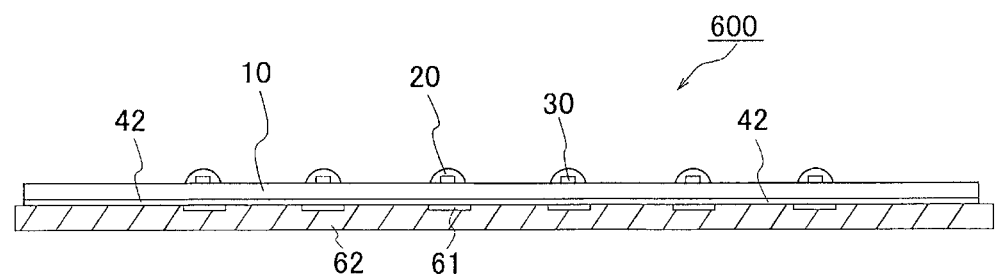
FIG. 8 is a schematic side view showing a light emitting device according to still another embodiment of the present invention.

The light emitting device 600 according to Embodiment 7 has, as shown in FIG. 8, a substantially similar structure as that of the light emitting device 500 of Embodiment 6, except that the adhesion layer 42 having a uniform thickness is formed and partially not be covered with the non-adhesion layer 52. The present embodiment includes a structure in which a light emitting device 600 as described above is adhered to a support member (for example, an aluminum substrate) 62 having recesses 61 in the surface regions which correspond to the regions where the light emitting elements 20 are arranged. In the present embodiment, the depth of the recesses of the support member can be, for example, about 50 μm. As described above, due to the recesses 61, the periphery of the light emitting element 30 is not fixed to the adhesion layer 42 and the support member 62, so that similar effects as in the light emitting device 100 of Embodiment 1 can be exerted. Moreover, an air layer is provided directly under the respective light emitting elements 20, so that with the use of the air layers, heat dissipation can be improved.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
    a flexible substrate having a first surface and a second surface different from the first surface, the flexible substrate including a flexible base member and a plurality of wiring portions disposed on a first surface side of the base member, the second surface of the flexible substrate being free of a conductive region;
    at least one light emitting element arranged on the first surface of the flexible substrate and electrically connected to the wiring portions;
    a sealing resin sealing the light emitting element; and
    an adhesion layer arranged on the second surface of the flexible substrate, the adhesion layer having a small thickness portion corresponding at least to a region on the first surface where the at least one light emitting element is arranged, the small thickness portion of the adhesion layer having a thickness smaller than a thickness of regions of the adhesion layer other than the portion, the adhesion layer defining concavity and convexity on a second surface side of the flexible substrate.

2. The light emitting device according to claim 1, wherein the thickness of the small thickness portion of the adhesion layer is zero.

3. The light emitting device according to claim 1, further comprising a separation layer disposed in the small thickness portion of the adhesion layer.

4. The light emitting device according to claim 3, wherein the separation layer has a thickness not greater than a depth of the small thickness portion.

5. The light emitting device according to claim 1, wherein on the first surface of the flexible substrate, the at least one light emitting element is electrically connected to the wiring portions via wires respectively, and the small thickness portion of the adhesion layer extends in a region corresponding to the region on the first surface where the at least one light emitting element is arranged and a region where the wires are arranged.

6. The light emitting device according to claim 1, wherein the small thickness portion has an area 1 to 100 times that of the at least one light emitting element.

7. The light emitting device according to claim 1, further comprising a support member disposed on a side of the second surface of the flexible substrate, the support member being arranged so that the support member does not adhere to the small thickness portion of the adhesion layer.

8. A light emitting device comprising:
a flexible substrate including a flexible base member and a plurality of wiring portions disposed on one surface of the base member;
at least one light emitting element arranged on a first surface of the flexible substrate and electrically connected to the wiring portions;
a sealing resin sealing the light emitting element; and
an adhesion layer arranged on a second surface of the flexible substrate different from the first surface of the flexible substrate, the adhesion layer having a small thickness portion corresponding at least to a region on the first surface where the at least one light emitting element is arranged, the small thickness portion of the adhesion layer having a thickness smaller than a thickness of regions of the adhesion layer other than the portion, the adhesion layer is free of a conductive member, the adhesion layer defines concavity and convexity on a second surface side of the flexible substrate.

9. A light emitting device comprising:
a flexible substrate including a flexible base member and a plurality of wiring portions disposed on one surface of the base member;
at least one light emitting element arranged on a first surface of the flexible substrate and electrically connected to the wiring portions;
a sealing resin sealing the light emitting element; and
an adhesion layer arranged on a second surface of the flexible substrate different from the first surface of the flexible substrate, the adhesion layer having a small thickness portion corresponding at least to a region on the first surface where the at least one light emitting element is arranged, the small thickness portion of the adhesion layer having a thickness smaller than a thickness of regions of the adhesion layer other than the portion, the adhesion layer being made of resin material, the adhesion layer defining concavity and convexity on a second surface side of the flexible substrate.

* * * * *